United States Patent [19]

Rabe et al.

[11] Patent Number: 4,558,237
[45] Date of Patent: Dec. 10, 1985

[54] LOGIC FAMILIES INTERFACE CIRCUIT AND HAVING A CMOS LATCH FOR CONTROLLING HYSTERESIS

[75] Inventors: Robert L. Rabe, Maple Grove; Paul J. Swan, Brooklyn Center, both of Minn.

[73] Assignee: Honeywell Inc., Minneapolis, Minn.

[21] Appl. No.: 595,573

[22] Filed: Mar. 30, 1984

[51] Int. Cl.[4] .............. H03K 19/094; H03K 19/092; H03K 19/017; H03K 3/356

[52] U.S. Cl. ............................ 307/475; 307/451; 307/279

[58] Field of Search .............. 307/446, 475, 264, 270, 307/279, 288, 451

[56] References Cited

U.S. PATENT DOCUMENTS

| | | | |
|---|---|---|---|
| 3,873,856 | 3/1975 | Gerlach et al. | 307/279 |
| 4,075,690 | 2/1978 | Oberman et al. | 307/279 X |
| 4,258,272 | 3/1981 | Huang | 307/475 |
| 4,406,957 | 9/1983 | Atherton | 307/475 |
| 4,430,582 | 2/1984 | Bose et al. | 307/475 X |
| 4,469,959 | 9/1984 | Luke et al. | 307/475 X |
| 4,471,242 | 9/1984 | Noufer et al. | 307/475 |
| 4,472,647 | 9/1984 | Allgood et al. | 307/475 |
| 4,501,978 | 2/1985 | Gentile et al. | 307/279 X |
| 4,504,747 | 3/1985 | Smith et al. | 307/475 |

OTHER PUBLICATIONS

Dingwall, "TTL-to-CMOS Buffer Circuit"; RCA Technical Notes; TN No.: 1114; 3 pp.; 6/11/1975.

Primary Examiner—Larry N. Anagnos
Attorney, Agent, or Firm—Theodore F. Neils

[57] ABSTRACT

An interface circuit to couple logic signals from a logic gate of one kind of logic family to a logic gate of another operating at different logic state voltages, where a latch circuit is used with the first of two cascaded inverters to provide the desired interface circuit signal characteristics. One inverter is provided with a supply reduction threshold means as is another inverter in the latch so that the two inverters perform substantially similarly to one another. The latch allows independent adjustments of opposite direction logic level transitions to provide a desired noise margin.

15 Claims, 1 Drawing Figure

LOGIC FAMILIES INTERFACE CIRCUIT AND HAVING A CMOS LATCH FOR CONTROLLING HYSTERESIS

BACKGROUND OF THE INVENTION

The present invention relates to transition logic circuits for use in the interface between logic gate circuits from different logic families, and more particularly, to transition circuits for use at the interface between logic circuits of the transistor-transistor logic (TTL) circuit family and the complementary metal-oxide-semiconductor field-effect transistor (CMOS FET) logic circuit family.

Various kinds of logic gate circuit families each have their peculiar advantages and disadvantages. At interfaces between different systems or system components, one system or a component thereof will have used logic gate circuits from one kind of logic family while the subsequent system, or a component thereof, will have for one or another reason used gates from another kind of logic family. Also quite often in the integrated circuit technology of today, the optimum solution for the design of a particular logic system is to use logic gate circuits from more than one kind of logic family in accomplishing such a design in the form of a monolithic integrated circuit. These situations pose some difficulty because the logic gate circuits of each different logic family must be operated at differing voltage levels for each logic state and these levels, in each family, will have a different voltage value separating them. This situation requires some sort of transition circuit to permit the logic signals, obtained from logic gate circuits in one kinds of logic family, to be applied to logic gate circuits of another kind of logic family.

However, the design of such transition circuits must not seriously compromise a performance of an entire logic system involving gates taken from various kinds of logic families. Therefore, the transition circuit must operate with approximately the same switching rapidity as do the logic gate circuits in each of the logic gate family types being interfaced. So, where two different kinds of logic families are intended to be used in a system and a logic gate from one must be at an interface with another, and each are capable of very rapid switching, the transition circuit at the interface between the two gates must also be capable of very rapid switching. Yet, at the same time, this transition circuit must provide the transition between the various voltage levels normally employed in each of the two logic family types.

Further, the transition circuit must be capatible with the fabrication process for forming at least one kind of the chosen logic gate families in order that the transition circuit may be integrated on the same monolithic integrated circuit chip as that part of the system of such logic gate family. Also, the space taken by the transition circuit being formed on the monolithic integrated circuit chips should be as small as possible to aid in achieving a high density of logic functions in such chips.

A commonly encountered situation is in going from the logic levels used with TTL logic circuits to those used with CMOS FET logic circuits. Assuming that the power supply voltage available is a positive 5.0 volts with respect to ground, the TTL logic family has a logic gate output voltage specified as being 0.4 volts as the maximum output voltage for logic level "0". The specified at output voltage value for a logic level "1" for this family is a minimum voltage value of 2.4 volts.

To maintain an adequate noise margin during operation, a circuit driven by such a TTL logic gate should accept as a "0" logic level of voltage somewhat greater than 0.4 volts, and should accept as a "1" logic level a voltage somewhat less than 2.4 volts. Best of all in this reagard, a circuit to follow such a TTL logic gate should be caused to switch between it logic levels in approximately the center of this range of TTL logic family output voltages, or somewhere around 1.4 volts to provide the greatest possible symmetric noise margins.

For the same positive 5 volt power supply with respect to ground, a CMOS FET logic circuit output will operate with a "0" logic level at a voltage much nearer ground than a TTL logic gate, and a "1" logic level much nearer the 5 volt supply level. More importantly, the input voltage switching point of a CMOS FET logic gate circuit is typically one half of the power supply voltage, or around 2.5 volts in this instance. Obviously, this is incompatible with the TTL logic gate output voltage midpoint of 1.4 volts occurring midway between the worst case logic level voltage values of 0.4 volts and 2.4 volts. Further compounding the situation is that the switching point for CMOS FET logic gate circuits—one-half the power supply voltage—is but a nominal switching point. The actual switching point can vary considerably as a result of variations in the fabrication process for the CMOS FET logic circuit, and also through power supply variations and temperature variations. Thus, a transition circuit is desired which provides a transition from the TTL logic family to the CMOS FET logic family in view of these differences, while at the same time meeting the above indicated goals.

SUMMARY OF THE INVENTION

The present invention provides a transition circuit for use at the interconnection interface between two logic gates, each from a different logic gate family, through using two cascaded inverters having a latch arrangement electrically connected at the point these inverters are electrically connected to one another. One inverter is provided with a supply reduction threshold means as is another inverter in the latch so that the two inverters perform substantially similarly to one another. The latch allows independent adjustments of opposite direction logic level transitions to provide a desired noise margin.

DESCRIPTION OF THE PREFERRED EMBODIMENT

Figure 1:
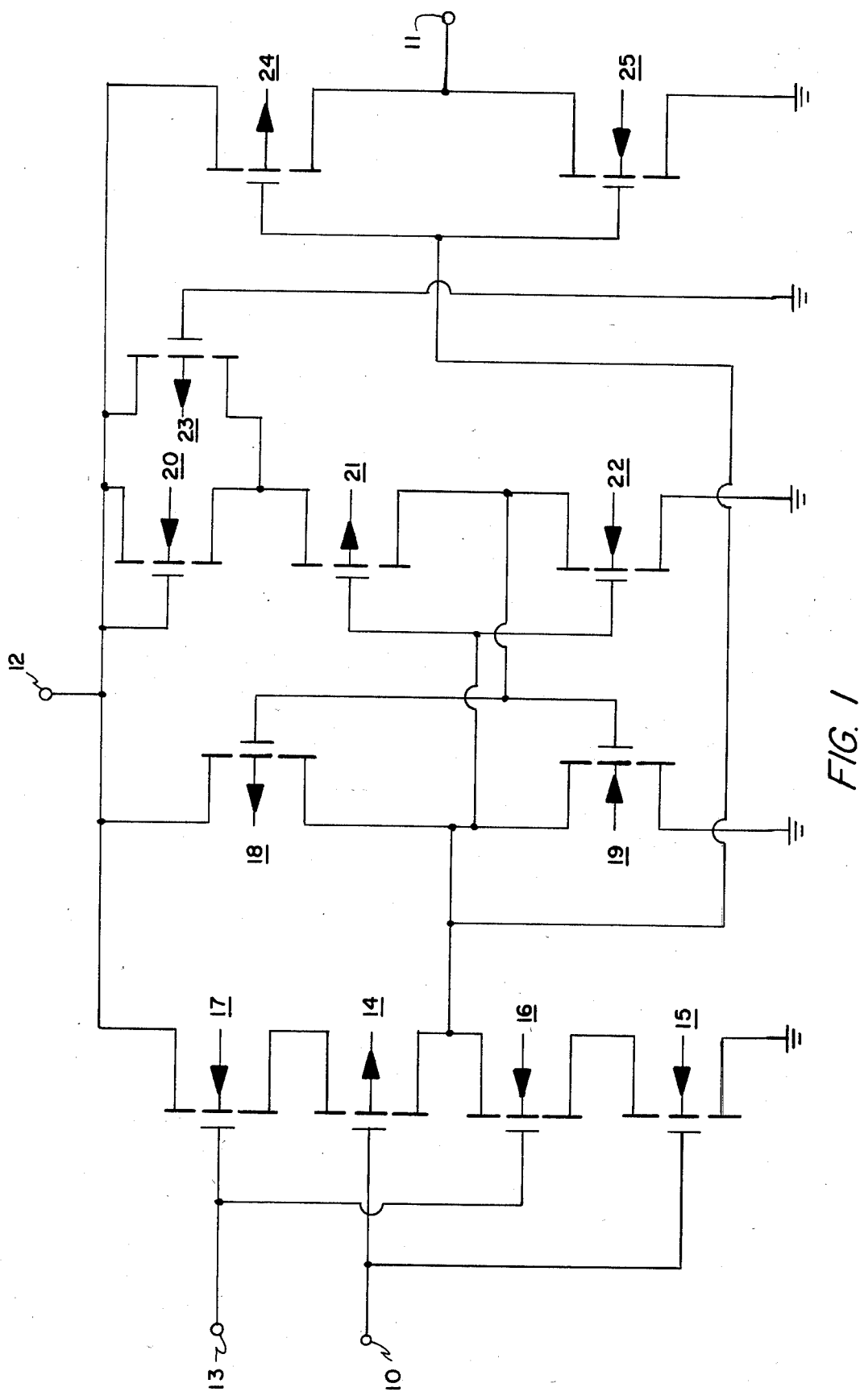
FIG. 1 shows the circuit schematic of the present invention.

Shown in FIG. 1 is a transition circuit for providing an interconnection interface between the output of a TTL logic gate circuit, intended for connection to a primarily logic signal input, 10, and the input of a CMOS FET logic gate circuit intended for connection to the transition circuit output designated 11. The circuit shown in FIG. 1 can be fabricated in a monolithic integrated circuit chip through use of any suitable fabrication process for fabricating chips containing complementary insulated gate field-effect transistors of which several are well known.

For instnace, a p-type conductivity substrate can be used in which each enhancement mode, n-channel insulated gate field-effect transistor (IGFET), e.g. silicon gate, metal-oxide-semiconductor field-effect transistor (MOSFET), is formed directly. Each enhancement mode, p-channel IGFET or silicon gate MOSFET is formed in a n-conductivity type region, often called a well or a tub, which is formed in this p-type conductivity substrate. In such an arrangement, each substrate connection for each n-channel MOSFET is made to the p-type conductivity substrate and this substrate is connected to the most negative supply voltage in the circuit, usually ground. Each of the p-channel MOSFET substrate connections is made to the n-type conductivity well, which wells in turn are each, typically, all electrically connected to the most positive supply voltage in the circuit, typically 5.0 volts. Such substrate connections are not explicitly shown in the circuit of FIG. 1 to minimize schematic diagram complexity.

As stated, typically in operation, the transition circuit has its positive voltage supply terminal, 12, electrically connected to a positive voltage supply of 5 volts with respect to ground. Ground, or zero volts, is the voltage supply value to which each of the circuit points of FIG. 1 having the ground symbol are electrically connected in such typical operation. A further control input, 13, to the transition circuit can be used, through grounding this terminal, to place the transition circuit in a standby mode to prevent logic signal transitions from propagating therethrough while at the same time minimizing any power drain during the time the circuit is in such a mode. Alternatively, and during the first portion of the description following, input terminal 13 will be assumed to be at a value near the voltage occuring on power supply connection 12 so that the transition circuit of FIG. 1 is in an operational mode rather than the standby mode. The standby mode situation will be described thereafter.

The n-channel MOSFETs in the circuit have a common channel length so that they perform similarly to one another over fabrication process and operating temperature variations, and so do all but one of the p-channel MOSFETs. After fabrication, these n-channel and p-channel MOSFETs will all have approximately the same effective channel length even though they will be designed with different channel lengths initially, the differences compensating for somewhat different results in the fabrication process for the two kinds of transistors. Thus, differences in the desired "on" condition resistance for these transistors will be provided through selecting different channel widths, or otherwise providing a series combination of the same kind of transistors to achieve, in effect, a longer channel length.

Also, steps taken in the fabrication process to set the value of the threshold voltage for both the n-channel and p-channel MOSFETs results in both kinds of transistors having a zero source-substrate difference threshold voltage of approximately the same magnitude, but of opposite sign as the nature of the two kinds of transistors requires. The zero source-substrate difference threshold voltage values for the n-channel MOSFET's is approximately 0.8 volts, and for the p-channel transistors it is approximately −0.8 volts. Variations of the threshold voltage due to fabrication process variations lead to the similar change in value and in a common direction for both n-channel and p-channel MOSFET's. However, changes in thredhold voltage due to temperature affect the magnitude of the threshold voltage of each kind of transistor only.

Logic signals occurring at the output of a TTL logic gate, and so at input terminal 10, are applied to an input inverter comprising a p-channel MOSFET, 14, and an n-channel MOSFET, 15. A further n-channel MOSFET, 16, intervenes in the inverter circuit in being between transistors 14 and 15 through having the drain of transistor 16 connected to the drain of transistor 14 and the source of transistor 16 connected to the drain of transistor 15. However, transistor 16 is kept strongly in the "on" condition because of its gate being connected to input 13 since, as indicated above, the voltage on gate 13 is very near that on terminal 12 when the transition circuit is in the operating mode. Thus, transistor 16 contributes only a small "on" condition resistance between transistors 14 and 15 so that these latter two transistors form essentially a normally operating CMOS inverter.

This inverter, however, operates from, effectively, a reduced voltage supply by virtue of the presence of a further n-channel MOSFET, 17, which has its source connected to the source of transistor 14 and has its drain connected to terminal 12. Because the gate of transistor 17 is connected to terminal 13 which is approximately at the voltage value of terminal 12 for the transition circuit being in the operating mode, and because the source of transistor 17 must be at a lower voltage than the gate of transistor 17 by at least the threshold voltage for that transistor if transistor 17 is to pass any current, the source of transistor 17 will be at a voltage value lower than the voltage on terminal 12 by at least the threshold voltage of transistor 17.

Furthermore, the effective threshold voltage of transistor 17 will be greater than the 0.8 volts described previously as the zero source-substrate difference threshold voltage for the n-channel MOSFET's because the substrate of the circuit is operated at ground potential while the source of transistor 17, as just indicated, is at a substantially greater voltage. The effect of the resulting increase reverse bias on the channel of transistor 17 leads consequently to increasing the effective threshold voltage of that transistor, the well known "body effect" for MOSFET's.

In the present instance, the effective threshold voltage of transistor 17 will be approximately 1.5 volts leading to the inverter comprising transistors 14 and 15 operating, in effect, with a supply voltage of approximately 3.5 volts. This reduced, effective supply voltage leads to a reduction in the switching voltage of the inverter comprising transistors 14 and 15 since the switching voltage at the input of the inverter is, as stated, on the order of one half the voltage supply to the inverter in the absence of further measures to change the switching voltage point. Note that the channel width of transistor 17 is chosen twice that of any of transistors 14, 15 or 16 to assure a relatively low value of "on" resistance for that transistor so that switching transients in the input inverter will have relatively little effect on the voltage appearing at the source of transistor 17.

The use of transistor 17 to reduce the supply voltage effectively supplied to the transition circuit input inverter comprising transistors 14, 15 and 16 has another effect which serves to reduce the switching point of this inverter. That occurs because the substrate of p-channel transistor 14 is connected to the voltage occurring at terminal 12 but the source of transistor 14 is at a lesser voltage because of the use of transistor 17 to reduce the effective voltage supply to the inverter. Thus, there is an increase in the reverse bias voltage between the substrate and the channel of transistor 14 which has the effect of decreasing the threshold voltage of transistor 14 from the zero source-substrate difference value of −0.8 volts to a value of approximately −1.1 volts.

Transistors 14 and 15 are chosen to be approximately the same channel width which directly leads to reducing the switching point of the inverter comprising these two transistors to being below the typical half of the supply voltage point because the reduced hole mobility of p-channel MOSFET's limits the current they provide vis-a-vis n-channel MOSFET's. Further, transistor 14, as just described above, has a reduced threshold voltage. As a result, as the voltage on input 10 common to the gates of both transistors 14 and 15 during a logic level transition approaches the switching voltage of the input inverter, transistors 14 and 15 will be operated somewhat differently. Transistor 15 will have a typical difference between its gate and its threshold voltage, but transistor 14 will have smaller difference between its gate and threshold voltage than transistor 14 would otherwise have because of the decreased threshold voltage of transistor 14.

So, transistor 14 tends toward having a reduced current providing capability as a source more quickly during a positive logic level transition at input 10 than it otherwise would with this decreased threshold voltage because of the well known "square law" governing the relationship between channel current and the applied gate voltage in an insulated gate field-effect transistor operating in the "pinch-off" region. Furthermore, transistor 14 has, in any event, a somewhat reduced capability to provide current as a source than would normally be the case in typical inverter designs because of the choice of gate widths for transistors 14 and 15, this situation being due to the lower mobility of holes in the channel of transistor 14 (i.e., a greater "on" resistance). Transistor 15, retaining its usual capability to draw current as a sink, will require less gate voltage to take up the reduced current from transistor 14.

Conversely, during a negative logic level transition at input 10, transistor 15 tends to retain a significant capability to draw current as a sink at a lower voltage on terminal 10 than transistor 14 does to supply current as a source. In both kinds of logic level transitions at input 10, then, the switching point is effectively at a lower voltage that it would otherwise be. Thereby, the nominal input switching voltage of the input inverter is brought to approximately that of the midpoint between the TTL logic gate worst case output logic levels of 1.4 volts, ignoring loading effects on the output of the input inverter.

A further advantage to the use of transistor 17 in reducing the voltage effectively supplied to the input inverter is a reduction in the static power consumption of the transition circuit in the operating mode during those times in which the TTL high level logic signal remains at input 10 of the transition circuit. Such a logic level may be as low as 2.0 volts (2.4 volts worst case less a noise margin of 0.4 volts) although nominally intended to be around 2.8 volts. In those instances where the TTL upper logic level is somewhere near 2.0 volts at terminal 10, the gate of transistor 14 could be a few tenths of a volt below the threshold voltage for transistor 14 so that transistor 14 could provide some amount of current which will be shunted to ground either through transistor 15 or a further transistor loading the output of the input inverter. Were it not for the use of transistor 17 lowering the voltage occuring at the source of transistor 14, a much larger current would flow worsening the static power consumption of the transition circuit considerably.

This reduced current sourcing capability of transistor 14 when an upper logic level occurs at input 10 from what it would otherwise be in the absence of transistor 17 does not significantly slow circuit switching because the only operation in which substantial current is required from transistor 14 as a source to operate circuits connected to the output of the input inverter is during a negative going logic level transition at input 10. In these circumstances, transistor 14 will be able to supply sifficient current easily because of the "square law" relationship governing the amount of current transistor 14 provides for the voltage present on the gate thereof.

A further effect on the input inverter, leading to the transition circuit of FIG. 1 having input switching voltages differing from the nominal switching voltage just described during logic level transitions at input 10, comes from the current loading at the output of this inverter. This output of the input inverter is taken between the drains of transistors 14 and 16 thereof to which both a latch circuit and an output inverter are connected. The latch circuit comprises a pair of inverters, the first of which comprises a p-channel MOSFET, 18, and a composite n-channel MOSFET, 19, together with transistor 19 actually representing a composite of four n-chanel MOSFET's connected in series to be further described below. Transistor 18 has a source thereof electrically connected terminal 12 and transistor 19 has a source thereof connected to ground. The drains of transistors 18 and 19 are connected to one another to serve as the first latch inverter circuit output, and to both the output of the input inverter circuit and to the input of the second inverter circuit in the latch circuit. The gates of transistor 18 and 19 are connected together to form the input of the first latch inverter circuit.

This second latch inverter circuit is supplied effectively a reduced operating voltage through a n-channel MOSFET, 20, and comprises a p-channel MOSFET, 21, and another n-channel MOSFET, 22. The drain and gate of transistor 20 are connected to terminal 12, and the source of transistor 20 is connected to the source of transistor 21. The source of transistor 22 is connected to ground, and the drains of transistors 21 and 22 are connected together as the output of the second latch inverter and to both of the gates of transistors 18 and 19 serving as the input of the first latch inverter. The second latch inverter circuit input is formed jointly by the interconnected gates of transistors 21 and 22.

A further p-channel MOSFET, 23, is provided with this second latch inverter to prevent an unwanted current flow in situations where input 10 is at an upper logic level as will be described below. The source of transistor 23 is connected to terminal 12 with the gate thereof connected to ground. The drain of transistor 23 is connected to the source of transistor 20 and the source of transistor 21.

The output inverter comprises a p-channel MOSFET, 24, and a n-channel MOSFET, 25. The source of transistor 24 is connected to terminal 12, and the source of transistor 25 is connected to ground. The drains of transistors 24 and 25 are connected together and serve as the output of both the output inverter and of the entire transition circuit. The gates of transistors 24 and 25 are connected together and serve as the input of the output inverter circuit which, as previously indicated, is connected to the output of the input inverter.

In this arrangement, only transistors 18 and 19 of the first latch inverter constitute any significant current loading of the output of the input inverter at the connection of the drains of transistors 14 and 16. All other connections made to the input inverter output are by gates of the other various insulated gate field-effect transistors in the second latch inverter and in the output inverter which gates permit no significant current to pass. As a result, only current provided by transistor 18 as a source to, and current drawn by transistor 19 as a sink from, the output of the input inverter will effect the switching point of that inverter.

Transistors 18 and 19 are structured in such a manner as to provide two different switching points for the input inverter, a higher valued switching point for positive logic level transitions at input 10 of the inverter, and a lower voltage switching point for negative logic level transitions at input 10. By providing this hysteresis in the input voltage switching characteristic at input 10 of the transition circuit for opposite going logic level transitions occurring at this input, an increased noise margin is provided to reduce the possibility of transitions to an erroneous logic state in the transition circuit due to electrical transients in the circuit or to power supply variation, for example. Further, this characteristic prevents dithering between states due to electrical transients occurring during logic level transitions at input 10.

Assume first that input 10 of the transition circuit, and of the input inverter, is initially at a low TTL logic level and is to undergo a transition to the upper TTL logic level. In this circumstances, transistor 15 is in the "off" condition while transistor 14 is in a condition of being capable of providing current as a source. (As indicated above, in the operating mode of the transition circuit transistors 16 and 17 are always in the "on" condition.) The channel widths of both input inverter transistors 14 and 15 are chosen relatively large compared to those of transistors 18 and 19 so the latch circuit will always be forced to follow the input inverter because of the input inverter thereby having a greater capability to control current as either a source or a sink. Therefore, in these circumstances, transistor 19 can be assumed to be in the "off" condition while transistor 18 will be in the condition of having the capability of providing current at its drain as a source.

During the logic level transition from low to high at input 10, transistor 15 becomes more capable of drawing current as a sink while transistor 14 becomes less able, in terms of the voltage occurring on its gate, to provide current as a source. (Note transistor 14 will not be supplying any current when input 10 is in the low logic state because transistor 18, being also able to provide current as a source in this circumstance, will have the inverter circuit output at a voltage nearly equal to that on terminal 12 preventing any current from flowing at the drain of transistor 14.) The input inverter would switch at the nominal switching point previously described were it not that transistor 15, in addition to drawing current that comes to be provided by transistor 14 (some current will flow through transistor 14 during the switching sequence transition), must also draw the current provided by transistor 18. As a result, there must be somewhat larger voltage at input 10 to enable transistor 15 to draw this added current, and so, the effective switching point of this input inverter, and hence the transition circuit switching point, is increased.

The amount of this increase is determined by the amount of current supplied through transistor 18 which is set by choosing its channel width to thereby set its "on" resistance which determines the current contribution of 18 in connection with the other effective channel resistances connected to the output of the input inverter. The switching point is chosen to increase typically 0.2 volts.

When transistor 15 becomes able during the transition to draw sufficient current from both transistors 14 and 18 and moves toward being capable of drawing more than can be supplied, the voltage drops rapidly at the output of the input inverter, and so at the input of the second latch inverter at the gates of transistors 21 and 22. This in turn causes the second latch inverter output voltage to rise at the drains of transistors 21 and 22 such that the voltage rises at the input of the first latch inverter at the gates of transistors 18 and 19 leading to regeneration in the latch circuit, and thereby switching the latch into its new state. Hence after the transition, transistors 14 and 18 are both in the "off" condition and transistors 15 and 19 are both in the state where each could draw current as a sink if available.

As for the second latch inverter, transistor 22 is in the "off" condition while transistor 21 is in a condition in which it could provide current as a source. Note that transistor 20 operates as a source follower essentially as transistor 17 does, and so similarly provides a reduced voltage at its source for operating the second latch inverter circuit comprising transistors 21 and 22. The purpose of transistor 20 will be made clear below.

For the opposite going logic level transition at input 10, transistor 14 will go from the "off" condition (or nearly "off" condition as indicated above) toward being able to provide a significant current as a source. Transistor 15 will go from being in a condition able to draw a substantial amount of current as a sink to being in the "off" condition. Again, the switching point for the input inverter would be the nominal value as initially described without loading were it not that transistor 19 is in a condition of being able to draw a significant amount of current as a sink as indicated above. The result, because of transistor 19 is that the voltage on input 10 will have to reach a lower value for transistor 14 to provide enough current to overcome the ability of transistor 19 to sink such current to thereby permit an increase in voltage at the drain of transistor 14 and so as the input of the second latch inverter formed by the gates of transistors 21 and 22. This increased voltage at the second latch inverter input switches the output of this inverter, and thus the first latch inverter, to thereby switch the latch circuit to the alternate state through regeneration of the latch circuit comprising transistors 18 through 22. The required lower voltage on input 10 to initiate this switching sequence means the switching point of the input inverter, and hence of the transition circuit, is lowered for negative logic level transitions at this input.

The amount of lowering is determined by the ability of transistor 19 to sink current which is set by its effective "on" resistance in connection with the other effective resistances occuring at the output of the input inverter. In practice, it has been found that a relatively large "on" resistance for transistor 19 is satisfactory to lower the switching point the desired 0.2 volts. Such an "on" resistance for transistor 19 were it not a composite transistor, would mean that either an inconveniently narrow channel width would be required for this transistor, or that an increased channel length would need to be used for this transistor leading to the transistor not performing over fabrication process and operating temperature variation like the other n-channel transistors used.

Therefore, transistor 19 is formed as a composite of four n-channel MOSFETs having their gates of each connected in common but with the channels of each provided in series. This series arrangement is provided through having the source of one connected to the drain of another except for the drain of one, and the source of the other, of the two end transistors in this series sequence. The drain of the one end transistor and the source of the other serve as the source and drain of the composite serving as transistor 19 shown in FIG. 1.

This series arrangement has the effect of increasing the effective channel length associated with composite transistor 19 while permitting the use of small but still convenient channel widths; yet, the channel length of each of the composite transistors is the same as it is for each of the other n-channel MOSFETs used in the circuit so that they are closely matched to one another and so will operate similarly in varied conditions. The composite serving as transistor 19, as a result, has a greater channel length to width ratio to give a larger "on" resistance.

As can be seen from the foregoing description, the nominal switching point, the positive transition actual switching point, and the negative transition actual switching point can be independently set by proper choices of circuit components. That is, the nominal switching point is set by the threshold voltage for transistor 17 which determines the operating voltage for the input inverter, and the threshold voltages for transistors 15 and 16, and the choices of gate widths thereof, to further determine the nominal switching point of the input inverter. Then, by adjusting the gate widths of transistors 18 and 19, or in the case of transistor 19 the effective gate length and the gate width, the loading of the input inverter output by these transistors 18 and 19 increases the transition circuit actual switching point above the nominal switching point for positive logic level transitions and decreases the transition circuit actual switching circuit point below nominal for negative logic level transitions.

The transition circuit of FIG. 1 has just two logic stages between input 10 and output 11, the input inverter and the output inverter. Connected to the junction of these two logic stages is the latch circuit which provides a load, as just described, to the input inverter at its output. The use of this latch circuit is what allows having just two cascaded inverter stages to provide CMOS FET logic state voltage levels at output 11 despite there being TTL logic state voltage levels at input 10. The use of a series of commonly designed CMOS FET inverters only would require more than two inverters to provide such a greater upper logic level voltage at output 11 because of the limited gain which can be achieved in having one inverter drive a subsequent inverter. However, the use of a latch circuit with its regeneration features due to positive feedback therein provides in effect the substantial gain required such that full CMOS FET logic level swings occur right at the output of the input inverter, and so the input of the output inverter.

Furthermore, where the logic level transitions at input 10 occur because of a slowly varying voltage excursion from one logic level to the next at input 10, the use of the latch circuit will provide at output 11 a sharply varying transition between the logic levels despite such a slow transition at input 10. Finally, the use of the latch circuit permits adjusting the current sourcing and the current sinking capabilities of transistors 18 and 19, respectively, to match changes occurring in the input inverter because of fabrication process variances or voltage supply variances, to thereby make the logic level transition switching voltages relatively constant. This will be shown in the following.

As has been described, actual switching voltages for positive and negative logic level transitions at input 10 are determined to a significant degree by the capabilities of transistors 18 and 19 to provide current as a source and to draw current as a sink, respectively. The latch circuit takes advantage of this situation to stabilize such switching points in the face of power supply voltage, fabrication process and operating temperature variation by adjusting such capabilities in concert with changes in the input inverter. This stabilization is accomplished through having the second latch inverter characteristics substantially match changes the input inverter characteristics. Since the second latch inverter provides the gate drive for the first latch inverter, such tracking of the input inverter changes by the second latch inverter results in adjusting the capability of the first latch inverter to provide current as a source and draw current as a sink.

To have the second latch inverter to approximately duplicate the performance of the input inverter, the second latch inverter is constructed in the same general manner. First, transistor 20 is used to lower the nominal switching point of the second latch inverter in the same manner as transistor 17 lowers the nominal switching voltage of the input inverter. In the operating mode, as earlier described, the signal at control input 13 is close to that voltage appearing on terminal 12 while the voltage at the gate of transistor 20 is just the voltage appearing at terminal 12. Since transistor 20 has the same channel length as does transistor 17, the two will operate approximately the same over temperature and will have approximately the same threshold voltage resulting from fabrication process. Having the same threshold voltage over operating temperature and fabrication process variation that transistor 17 has, the further choosing of the gate widths for transistor 20 in conjunction with the choice of gate widths for transistors 21 and 22 leads to a nominal voltage switching point at the input of the second latch inverter which is approximately that of the nominal switching voltage of the input inverter.

Again this follows because transistor 21 is similar in construction to transistor 14 while transistor 22 is similar in construction to transistor 15. The the corresponding transistors each have the same gate length and so will match each other in performance over operating temperature and fabrication process variation. The transistors of the second latch inverter, however, have narrower gate widths than those of the input inverter, which does not significantly affect performance matching, since they are connected only to gates with negligible current needs. Since the input inverter and the second latch inverter both operate from the voltage supply at terminal 12 through transistors 17 and 20, respectively, changes in the supply voltage affect the input inverter and the second latch inverter similarly.

By way of example, should an increase in power supply voltage occur or should there be a decrease in the threshold voltage of either transistor 17 or 14 because of temperature change or fabrication result, the switching point of the input inverter for a high to low logic level transition would intend to increase. This is because such changes or result would permit transistor 14 to behave as a larger valued current source which would provide more current to transistors 15 and 19 so that a lower input switching voltage would result unless transistor 19 became a better current sink. For transistor 19 to become a better current sink, an increase in the voltage occurring at the gate of transistor 19 is required. But this is just what is provided through transistors 20 and 21 for an increase in the voltage of terminal 12 or for a decrease in the threshold voltages of either transistors 20 or 21 which decrease would follow any such decrease in transistors 17 or 14, respectively, because of having similar construction.

Thus, the matching of the corresponding transistors leads to a compensating effect in the latch circuit for the changes occurring in the input inverter. The compensating effect will not be exact because of the ever-present minor differences between the corresponding transistors, and because transistor 19 is operating unsaturated in being in the "on" condition while transistors 17 and 14 are operating saturated as they are moving toward being in the "on" condition.

Again by way of example, should there be a decrease in the threshold voltages of either transistors 15 or 16, the switch point for a low to high logic level transition would tend to decrease as either transistors 15 or 16 become able to sink greater currents unless transistor 18 becomes able to provide more current as a source. However, the reduced threshold voltage for transistor 22 corresponding to the reduced threshold voltage in transistors 15 or 16 will lead to a lower voltage at the drain of transistor 22, and so to a lower voltage at the gate of transistor 18 thereby tending to increase the capability of transistor 18 to provide current as a source to counter the increase in current drawn by transistors 15 and 16.

Transistor 23 is electrically connected to always be in the "on" condition. As such, when the second latch inverter circuit has its output at an upper logic level, the source of transistor 21 is brought to a voltage nearly equal to that on terminal 12 rather than being less than terminal 12 voltage by the threshold voltage of transistor 20. This assures that transistor 18, in these circumstances, is fully in the "off" condition to prevent any small current from flowing therethrough. This flow could occur in some circumstances if the output of the second latch inverter was at the lower voltage which would result because of the threshold voltage of transistor 20 in the absence of transistor 23.

However, the current supplied by transistor 23 will not otherwise affect circuit operation because this current is limited to being quite small through choosing a length to width ratio for transistor 23 which is quite substantial. This choice leads to transistor 23 having a relatively large "on" resistance to insure that the capability of this transistor to serve as a source of current is quite limited. Transistor 23 is the one p-channel MOSFET which does not have a channel length equal to that of the other p-channel MOSFET's present, but instead a greater length. This length permits obtaining a substantial "on" resistance, and this greater length makes little difference otherwise as transistor 23 need not perform similarly to the others over fabrication process or operating temperature variation.

The output inverter comprising transistors 24 and 25 serves to isolate the output of the input inverter from any further loading by subsequent circuitry. This assures that the actual switching points occurring at input 10 of the transition circuit during transitions are not affected by such subsequent circuitry. The channel width of transistor 25 is chosen typically to be twice that of channel 24 to reduce the voltage switching point at the input of the output inverter to be approximately equal to the nominal switching voltage of the input inverter. This assures that the switching delays through the output inverter are approximately equal for both positive and negative logic level transitions.

As an alternative to the operating mode, the transition circuit of FIG. 1 can be placed in a standby mode with reduced power dissipation. As earlier indicated, the mode selection control is effected through choosing the voltage level on control input 13. To choose the operating mode, as stated previously, the voltage on control input 13 is brought to near that on terminal 12. However, the source of the voltage on control input 13 might be better chosen to be obtained from near the output of the power supply or from some other stable point in the system rather than from terminal 12. Terminal 12 is typically connected to a power line powering many circuits in the system containing the transition circuit of FIG. 1 leading to a lot of switching transients on the power line. Because the voltage at the source of transistor 17 is a threshold drop below that voltage occurring on control input 13, reducing the voltage variation occurring at terminal 13 will reduce the voltage variation occurring at the source of transistor 17 which supplies the operating voltage for the input inverter. Such variation can cause uncertainty in the switching voltage point of the input inverter, usually an undesireable effect. By choosing the voltage on control input 13 to be taken from a point relatively free of voltage variation, then variation in the input switching point from this source can be greatly reduced or eliminated.

Placing the transition circuit of FIG. 1 in the standby mode is accomplished by reducing the voltage on control input 13 to being close to ground. In this situation, transistor 17 will be placed in the "off" condition thereby removing operating voltage from the input inverter so that logic level transitions on input 10 no longer transferred through the input inverter to affect the latch circuit or the output inverter. In these circumstances, the latch circuit will remain in the state it was in prior to the changing of the voltage on control input 13 to a value close to ground. Further, if the voltage on control input 13 is again increased to near that of terminal 12, the state of the latch circuit will not change without a further logic level change at input 10.

Since CMOS FET inverters do not permit current pass, and so dissipate power, when there is no switching occurring in such inverters, the transition circuit of FIG. 1 would presumably not dissipate power in the standby mode. However, there are two possibilities for current flow in the standby mode were it not for the inclusion of transistor 16 in the input inverter. If the latch circuit were to end up in a state such that transistor 18 was in the "on" condition, current could flow therethrough and hence through transistor 15 to ground were it not that transistor 16 was in the "off" condition by virtue of the low voltage on control input 13. Similarly, as earlier described, transistor 14 may not always be placed in the fully "off" condition by an upper logic level voltage value at input 10. Again, current is prevented from flowing through transistor 14 by both transistors 16 and 17 being in the "off" condition.

The embodiments of the invention in which an exclusive property or right is claimed are defined as follows:

1. A transition circuit for interfacing logic gate circuits of differing logic family types, said transition circuit having a transition circuit input region adapted for connection to an input logic gate circuit of a first logic family type, where said first logic family type has a first family characteristic pair of logic state voltage levels, and said transition circuit having a transition circuit output region adapted for connection to an output logic gate circuit of a second logic family type, where said second logic family type has a second family characteristic pair of logic gate voltage levels, said first family characteristic pair separated by a voltage value differing from that voltage value separating said second family characteristic pair, said transition circuit comprising:

a first supply reduction threshold means having first and second terminal regions such that current will flow therebetween only if voltage therebetween exceeds a first threshold voltage value, said first supply reduction threshold means first terminal region being electrically connected to a first interconnection means adapted for electrical connection to a first electrical power supply means;

an input inverter means having first and second terminating regions, an output region and an input region serving as said transition circuit input region, said input inverter first terminating region being electrically connected to said first supply reduction threshold means second terminating region, said input inverter second terminating region being electrically connected to a second interconnection means adapted for connection to a second electrical power supply means;

an output inverter means having first and second terminating regions, an input region and an output region serving as said transition circuit output region, said output inverter input region being electrically connected to said input inverter output region, said output inverter first terminating region being electrically connected to a third interconnection means adapted for electrical connection to a third electrical power supply means, said output inverter second terminating region being electrically connected to a fourth interconnection means adapted for electrical connection to a fourth electrical power supply means; and a latch means having a latch load region which is electrically connected to said input inverter output region, said latch means comprising:

a first latch inverter having first and second terminating regions, an input region and an output region serving as said latch load region, said first latch inverter first terminating region being electrically connected to said first interconnection means and said first latch inverter second terminating region being electrically connected to said second interconnection means;

a second supply reduction threshold means having first and second terminating regions such that a current will flow therebetween only if voltage therebetween exceeds a second selected threshold voltage value, said second supply reduction threshold means first terminating region being electrically connected to said first interconnection means; and a second latch inverter having first and second terminating regions, an input region and an output region, said second latch inverter input region being electrically connected to said latch load region, said second latch inverter output region being electrically connected to said first latch inverter input region, said second latch inverter first terminating region being electrically connected to said second supply reduction threshold means second terminating region, and said second latch inverter means second terminating region being electrically connected to said second interconnection means.

2. The apparatus of claim 1 wherein said first supply reduction threshold means also has a control region which can be operated to either permit or prevent current flow between said first supply reduction threshold means first and second terminating regions.

3. The apparatus of claim 2 wherein said input inverter means comprises:

a p-channel insulated gate field-effect transistor having a source region, a drain region and a gate region, with said source region thereof being electrically connected to said first supply reduction threshold means second terminating region, and said gate region thereof being electrically connected to said transition circuit input region;

a first n-channel insulated gate field-effect transistor having a source region, a drain region and a gate region, with said drain region thereof being electrically connected to said p-channel insulated gate field-effect transistor drain region, and said gate region thereof being electrically connected to said first supply reduction threshold means control region;

a second n-channel insulated gate field-effect transistor having a source region, a drain region and a gate region, with said drain region thereof being electrically connected to said first n-channel insulated gate transistor source region, said source region thereof being electrically connected to said second interconnection means, and said gate region thereof being electrically connected to said transition circuit input region.

4. The apparatus of claim 3 wherein both said first supply reduction threshold means and said second supply reduction threshold means are n-channel insulated gate field-effect transistors.

5. The apparatus of claim 3 wherein said input inverter, said output inverter, said first latch inverter and said second latch inverter are all complementary insulated gate field-effect transistor inverters each having a portion of a p-channel insulated gate field-effect transistor therein serving as said first terminating region thereof, each having a portion of an n-channel insulated gate field-effect transistor therein serving as said second terminating region thereof, and each having an interconnection structure between gates of such transistors serving as said input region thereof.

6. The apparatus of claim 5 wherein both said first supply reduction threshold means and said second supply reduction threshold means are n-channel insulated gate field-effect transistors.

7. The apparatus of claim 6 wherein a p-channel insulated gate field-effect transistor is provided having a source region, drain region and a gate region, with said source region thereof being electrically connected to said first interconnection means, said drain region thereof being electrically connected to said second latch inverter first terminating region, and said gate region thereof being electrically connected to said second interconnection means.

8. The apparatus of claim 2 wherein both said first supply reduction threshold means and said second supply reduction threshold means are n-channel insulated gate field-effect transistors.

9. The apparatus of claim 1 wherein said input inverter, said output inverter, said first latch inverter and said second latch inverter are all complementary insulated gate field-effect transistor inverters each having a portion of a p-channel insulated gate field-effect transistor therein serving as said first terminating region thereof, each having a portion of an n-channel insulated gate field-effect transistor therein serving as said second terminating region thereof, and each having an interconnection structure between gates of such transistors serving as said input region thereof.

10. The apparatus of claim 9 wherein both said first supply reduction threshold means and said second supply reduction threshold means are n-channel insulated gate field-effect transistors.

11. The apparatus of claim 10 wherein all of said n-channel insulated gate field-effect transistors have a common channel length, and all of said p-channel insulated gate-field effect transistors have a common channel length.

12. The apparatus of claim 9 wherein all of said n-channel insulated gate field-effect transistors have a common channel length, and all of said p-channel insulated gate-field effect transistors have a common channel length.

13. The apparatus of claim 1 wherein said second supply reduction threshold means also has a control region which can be operated to either permit or prevent current flow between said first supply reduction threshold means first and second terminating regions, with said second supply reduction threshold means control region being directly electrically connected to said first interconnection means.

14. The apparatus of claim 13 wherein both said first supply reduction threshold means and said second supply reduction threshold means are n-channel insulated gate field-effect transistors.

15. The apparatus of claim 1 wherein a p-channel insulated gate field-effect transistor is provided having a source region, drain region and a gate region, with said source region thereof being electrically connected to said first interconnection means, said drain region thereof being electrically connected to said second latch inverter first terminating region, and said gate region thereof being electrically connected to said second interconnection means.

* * * * *